(12) United States Patent
Chu et al.

(10) Patent No.: US 8,045,408 B2
(45) Date of Patent: Oct. 25, 2011

(54) SEMICONDUCTOR INTEGRATED CIRCUIT WITH MULTI TEST

(75) Inventors: Shin-Ho Chu, Ichon (KR); Jong-Won Lee, Ichon (KR)

(73) Assignee: Hynix Semiconductor Inc. (KR)

( * ) Notice: Subject to any disclaimer, the term of this patent is extended or adjusted under 35 U.S.C. 154(b) by 153 days.

(21) Appl. No.: 12/363,338

(22) Filed: Jan. 30, 2009

(65) Prior Publication Data

US 2009/0207673 A1 Aug. 20, 2009

Related U.S. Application Data

(63) Continuation-in-part of application No. 12/169,594, filed on Jul. 8, 2008.

(30) Foreign Application Priority Data

Feb. 14, 2008 (KR) .................. 10-2008-0013560

(51) Int. Cl.
*G11C 7/00* (2006.01)
*G11C 8/00* (2006.01)
*G11C 29/00* (2006.01)

(52) U.S. Cl. ........ 365/201; 365/191; 365/195; 365/196; 365/230.03

(58) Field of Classification Search .................. 365/191, 365/195, 196, 201, 230.03
See application file for complete search history.

(56) References Cited

U.S. PATENT DOCUMENTS

| 6,037,799 | A | 3/2000 | McClure |
| 6,058,495 | A | 5/2000 | Lee et al. |
| 6,297,998 | B1 | 10/2001 | Van de Graaff et al. |
| 6,340,823 | B1 | 1/2002 | Kitade |
| 6,438,718 | B1 | 8/2002 | Cline |
| 6,550,028 | B1 * | 4/2003 | Akaogi et al. ................. 714/721 |
| 6,816,422 | B2 | 11/2004 | Hamade et al. |
| 2003/0120974 | A1 * | 6/2003 | Adams et al. .................... 714/31 |
| 2008/0002478 | A1 * | 1/2008 | Park .......................... 365/189.04 |

FOREIGN PATENT DOCUMENTS

| JP | 08054446 | | 2/1996 |
| JP | 11-297095 | | 10/1999 |
| JP | 2000036523 | | 2/2000 |
| KR | 1020000031922 | A | 6/2000 |
| KR | 100892669 | A | 4/2009 |

* cited by examiner

*Primary Examiner* — Ly D Pham
(74) *Attorney, Agent, or Firm* — Baker & McKenzie LLP

(57) ABSTRACT

A semiconductor integrated circuit includes a multi-mode control signal generating unit configured to control an activation of a up/down mat I/O switch control signal, which controls I/O switches in a up/down mat, according to a multi-test mode signal and a read/write discriminating signal, a multi-mode decoder configured to output multi-mat select signals to simultaneously activate a plurality of mats according to a multi-test mode active write signal, and a mat controller configured to enable word lines and the I/O switches according to the up/down mat I/O switch control signal and the multi-mat select signals.

19 Claims, 7 Drawing Sheets

310,320

SEMICONDUCTOR INTEGRATED CIRCUIT WITH MULTI TEST

CROSS-REFERENCES TO RELATED APPLICATION

The present application claims priorities under 35 U.S.C. 119(a) to Korean application number 10-2008-0013560, filed on Feb. 14, 2008, in the Korean Patent Office and as a continuation-in-part to U.S. application Ser. No. 12/169,594, filed on Jul. 8, 2008, in the U.S. Patent and Trademark Office which are incorporated by reference in its entirety as if set forth in full.

BACKGROUND OF THE INVENTION

1. Technical Field

The embodiments described herein relate to a semiconductor integrated circuit and, more particularly, to a semiconductor integrated circuit capable of reducing test time.

2. Related Art

Generally, in semiconductor integrated circuits, one mat is selected when a burn-in test (or normal test) is carried out. Word lines which are correspondent to the selected mat are enabled and then a read or write test is carried out.

Recently, in the semiconductor integrated circuits, the test is carried out by enabling row and column address signals independently for all the cells. Therefore, the test time is increased so that the cost is also increased.

Accordingly, in order to reduce the test time, it is required to provide a test circuit that is capable of simultaneously carrying out an active-related test (for example, a test to activate a plurality of word lines) and a read/write-related test (for example, a test to activate a plurality of sense amplifiers) with activating a plurality of mats.

SUMMARY

A semiconductor integrated circuit capable performing a multitest with a reduced test time is described herein.

According to one aspect, a semiconductor integrated circuit comprises a multi-mode control signal generating unit configured to control an activation of a up/down mat I/O switch control signal, which controls I/O switches in a up/down mat, according to a multi-test mode signal and a read/write discriminating signal, a multi-mode decoder configured to output multi-mat select signals to simultaneously activate a plurality of mats according to a multi-test mode active write signal, and a mat controller configured to enable word lines and the I/O switches according to the up/down mat I/O switch control signal and the multi-mat select signals.

According to another aspect, a semiconductor integrated circuit comprises a multi-mode control signal generator configured to simultaneously active both at least one of a plurality of up mats and at least one of a plurality of down mats at an active mode, sequentially read out information from an activated mat at a read operation, and generate a control signal to simultaneously write information in an activated mat at a write operation.

The multi-mode control signal generator configured to receive a read/write discriminating signal and output the control signal, the read/write discriminating signal at the read operation is out of phase with that at the write operation, and the control signal generated at the read operation is out of phase with that generated at the write operation.

These and other features, aspects, and embodiments are described below in the section entitled "Detailed Description."

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION

Figure 1:
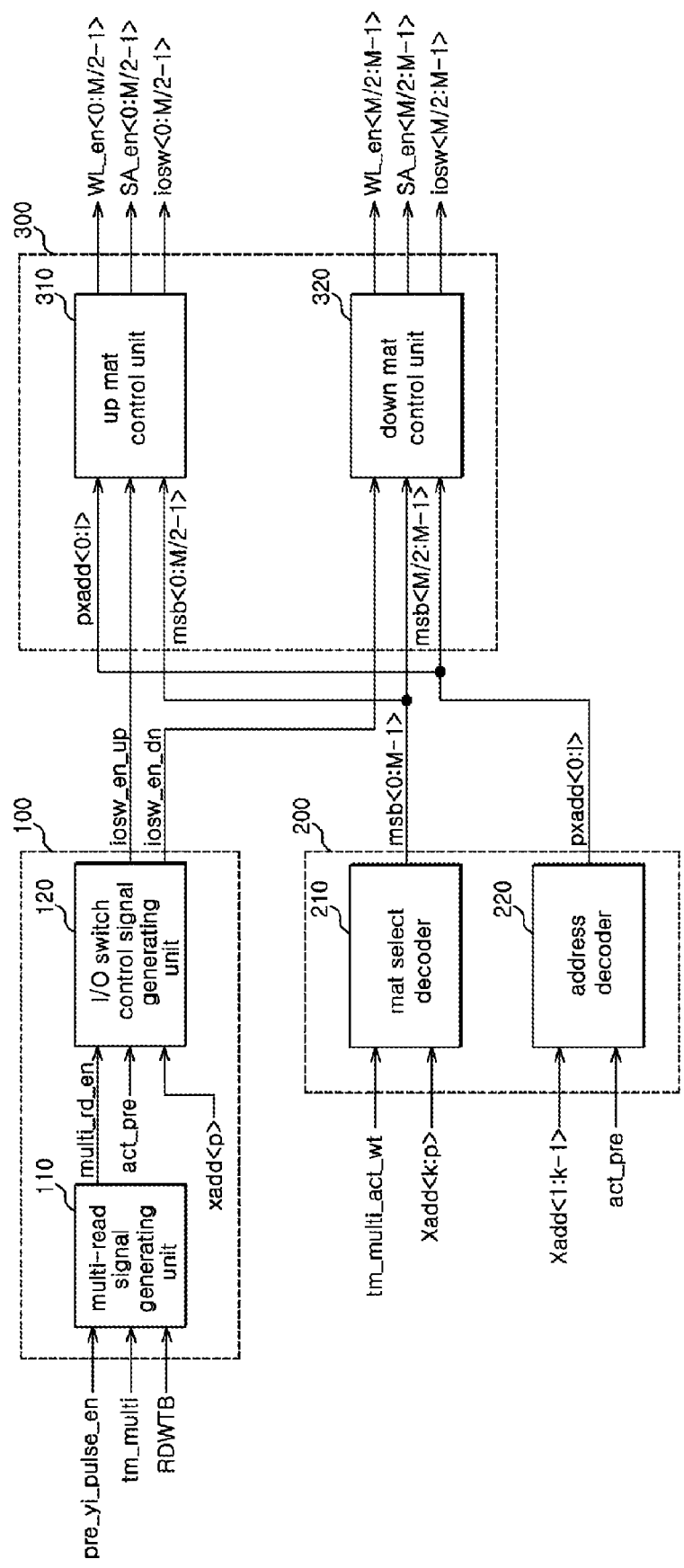
FIG. 1 is a block diagram illustrating an example of a structure of a test circuit according to one embodiment.

FIG. 1 is a block diagram illustrating an example of a structure of a test circuit according to one embodiment.

Referring to FIG. 1, a test circuit 1000 according to one embodiment can include a multi-mode control signal generating unit 100, a multi-mode decoder 200, and a mat control unit 300.

The multi-mode control signal generating unit 100 can be configured to activate up and down mats according to a multi-test mode signal 'tm_multi' and a read/write discriminating signal 'RDWTB'.

At a read operation mode, when the multi-test mode signal 'tm_multi' and the read/write discriminating signal 'RDWTB' are enabled to perform a multi-test, the multi-mode control signal generating unit 100 can be configured to enable one of an up mat I/O switch control signal 'iosw_en_up' to control I/O switches in the up mat and a down mat I/O switch control signal 'iosw_en_dn' to control the I/O switches in the down mat according to an up and down mat information address signal 'Xadd<p>'.

At a write operation mode, when the multi-test mode signal 'tm_multi' is enabled, the multi-mode control signal generating unit 100 can be configured to enable both the up mat I/O switch control signal 'iosw_en_up' and the down mat I/O switch control signal 'iosw_en_dn'.

The up and down mat information address signal 'Xadd<p>' is a signal that is input to the multi-mode control signal generating unit 100 in order to discriminate two consecutive read commands. This up and down mat information address signal 'Xadd<p>' is an address signal, but not used at the time of inputting a column-based command signals; however, a signal which is input through a data input mask pin (DM PIN) can serve as this address signal. Furthermore, the up and down mat information address signal 'Xadd<p>' is a signal that is used for discriminating the up mats from the down mats. For example, if the up and down mat information address signal 'Xadd<p>' is at a low level, this can be used as a driving signal for driving the up mat. If the up and down mat information address signal 'Xadd<p>' is at a high level, this can be used as a driving signal for driving the down mat.

For instance, assuming that the up mat is activated when the up and down mat information address signal 'Xadd<p>' is at a low level, the down mat is activated when the up and down mat information address signal 'Xadd<p>' is at a high level. Here, the up mat can be positioned over a center line of a bank and the down mat can be positioned below the center line. The same address signals, except for the up and down mat information address signal 'Xadd<p>', are used in the corresponding up and down mats.

The multi-mode control signal generating unit 100 is configured to enable one of the up mat I/O switch control signal 'iosw_en_up' and the down mat I/O switch control signal 'iosw_en_dn' according to an up and down mat information address signal 'Xadd<p>' at the read operation and to enable them at the write operation.

In more detail, the multi-mode control signal generating unit 100 can include a multi-read signal generating unit 110 and an I/O switch control signal generating unit 120.

The multi-read signal generating unit 110 can receive the read/write discriminating signal 'RDWTB', the multi-test mode signal 'tm_multi' and the column pulse enable signal 'pre_yi_pulse_en', and then outputs a multi-read signal 'multi_rd_en'.

Here, as may know from the signal name, the read/write discriminating signal 'RDWTB' at the read operation is different from that at the write operation in phase in order to definitely discriminate the read operation from the write operation and the read/write discriminating signal 'RDWTB' functions as a signal to selectively control a multi-read signal 'multi_rd_en'.

At the multi-test, the multi-read signal generating unit 110 can be configured to output the multi-read signal 'multi_rd_en' of a high level when the read/write discriminating signal 'RDWTB' is at a high level and the column pulse enable signal 'pre_yi_pulse_en' is at a high level. The multi-read signal generating unit 110 can be configured to output the multi-read signal 'multi_rd_en' of a low level when the read/write discriminating signal 'RDWTB' is at a low. The multi-test mode signal 'tm_multi' is a signal that is activated at the multi-test.

The column pulse enable signal 'pre_yi_pulse_en' is a signal to produce a column select signal 'yi'. When the column pulse enable signal 'pre_yi_pulse_en' is enabled, the column select signal 'yi' is enabled after a predetermined time and then data loaded on bit lines are transmitted to a pair of segment I/O lines SIO and SIOB.

The I/O switch control signal generating unit 120 receives an active signal 'act_pre', the up and down mat information address signal 'Xadd<p>' and the multi-read signal 'multi_rd_en', and then outputs the up mat I/O switch control signal 'iosw_en_up' and the down mat I/O switch control signal 'iosw_en_dn'.

The multi-mode decoder 200 simultaneously activates a plurality of mats according to a multi-test mode active write signal 'tm_multi_act_wt'.

At the active operation mode, the multi-mode decoder 200 activates multi-mat select signals 'msb<0:M−1>', which are correspondent to one of the up mats and one of the down mats, according to row address signals. At the active operation mode, the multi-mode decoder 200 can activate both word lines within one of the up mats and word lines within one of the up mats, i.e., the word lines within a plurality of mats.

In more detail, the multi-mode decoder 200 can include a mat select decoder 210 and an address decoder 220.

The mat select decoder 210 receives and decodes mat information address signals 'Xadd<k:p>' according to the multi-test mode active write signal 'tm_multi_act_wt' and then outputs the multi-mat select signals 'msb<0:M−1>'.

The multi-test mode active write signal 'tm_multi_act_wt' is a signal that is enabled at the active mode and the write operation mode. Accordingly, when the multi-test mode active write signal 'tm_multi_act_wt' is enabled, the multi-mat select signals 'msb<0:M−1>' to select one of the up and down mats are enabled so that the word lines within one of the up and down mats are simultaneously enabled. The multi-mat select signals 'msb<0:M−1>' have information that is capable of selecting a corresponding mat according to input row address signals.

The address decoder 220 receives the active signal 'act_pre' and the row address signals 'Xadd<1:k−1>' and then produces predetermined address signals 'pxadd<0:l>' by decoding the received address signals. A corresponding word lines are enabled according to the predetermined address signals 'pxadd<0:l>'. The predetermined address signals 'pxadd<0:l>' designate word line information within each mat.

The mat control unit 300 receives the up mat I/O switch control signal 'iosw_en_up', the down mat I/O switch control signal 'iosw_en_dn', the address signals 'pxadd<0:l>' and the multi-mat select signals 'msb<0:M−1>', and then enables the corresponding word lines, sense amplifiers, and I/O switches.

The mat control unit 300 receives the multi-mat select signals 'msb<0:M−1>' and the up mat I/O switch control signal 'iosw_en_up' and then outputs enable signals to enable the up mats, for example, word line enable signals WL_en<0:M/2−1>', sense amplifier enable signals 'SA_en<0:M/2−1>' and I/O switch signals 'iosw<0:M/2−1>'. Furthermore, the mat control unit 300 receives the multi-mat select signals 'msb<0:M−1>' and the down mat I/O switch control signal 'iosw_en_dn' and then outputs enable signals to enable the down mat, for example, word line enable signals 'WL_en<M/2:M−1>', sense amplifier enable signals 'SA_en<M/2:M−1>' and I/O switch signals 'iosw<M/2:M−1>'.

The mat control unit 300 can include an up mat control unit 310 and a down mat control unit 320.

The up mat control unit 310 receives the multi-mat select signals 'msb<0:M/2−1>' and the up mat I/O switch control signal 'iosw_en_up' and then outputs the up mat enable signals 'iosw<0:M/2−1>' to enable the up mat.

The down mat control unit 320 receives the multi-mat select signals 'msb<M/2:M−1>' and the down mat I/O switch control signal 'iosw_en_dn' and then outputs the down mat enable signals 'iosw<M/2:M−1>' to enable the down mat.

The up mat control unit 310 and the down mat control unit 320 outputs the word line enable signals 'WL_en<0:M−1>', the sense amplifier enable signals SA_en<0:M−1> and the I/O switch signals 'iosw<0:M−1>' of the corresponding mats.

Referring to FIG. 1, the test circuit 1000 according to the present disclosure reduces the test time by simultaneously activating two mats at the active mode in the test mode and sequentially reads out the data from the two mats one by one at the data read operation after the active operation. For example, at the time of a long RAS test, the plurality of the word lines are simultaneously involved in the test, by activating the word lines for a long time and carrying out the cell data read operation and, after the activation of the word lines, by sequentially reading the selected mats one by one. Since the word lines are simultaneously activated in the plurality of mats at the test mode, the read time can be largely reduced, as compared with that at the activation of each of the word lines.

Furthermore, in the case where the write operation is carried out after the read operation, the test circuit 1000 according to the present disclosure is configured to enter the write operation mode immediately after the read operation mode, but not configured to perform the write operation after the termination of the test or a precharge operation mode. That is, in the write operation mode after the above-mentioned read operation, the procedures in such a manner that the data are read from the up mat and thereafter the data are read from the down mat, like the read operation, are not carried out when the data loaded on the pair of the segment I/O lines SIO and SIOB are transmitted to a pair of local I/O lines, but the data loaded on the pair of the local I/O lines can be directly transmitted to the corresponding pair of the segment I/O lines SIO and SIOB. That is, in contrast to the prior art in which the data are read out one by one, the semiconductor integrated circuit according to the present disclosure can reduce the test time by simultaneously activating the plurality of the word lines at the time of the active operation and sequentially reading out the data from the plurality of cells in order to prevent a data collision at the time of transmitting the read-out data to the pair of the local I/O lines and further reduce the test time by directly entering the write operation mode, without an additional operation such as the precharging operation, at the time of mode change from the read operation mode to the write operation mode (or from the write operation mode to the read operation mode).

Figure 2:
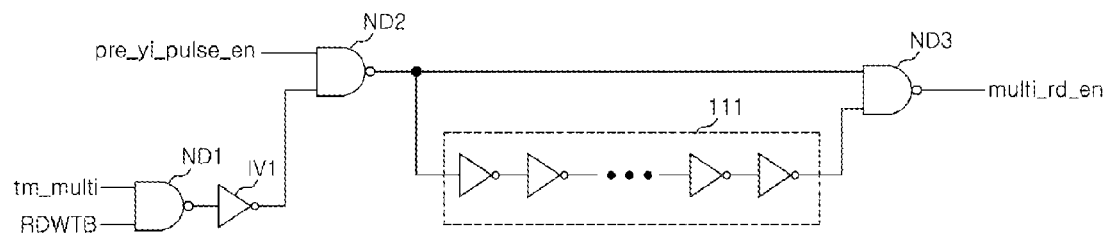
FIG. 2 is a detailed circuit diagram illustrating an example of a structure of a multi-read signal generating unit that can be included in the circuit shown in FIG. 1.

FIG. 2 is a detailed circuit diagram illustrating an example of a structure of the multi-read signal generating unit 110 in FIG. 1.

Referring to FIG. 2, the multi-read signal generating unit 110 can include a first NAND gate ND1, a first inverter IV1, a second NAND gate ND2, a delay unit 111, and a third NAND gate ND3.

The first NAND gate ND1 performs a NAND operation of the multi-test mode signal 'tm_multi' and the read/write discriminating signal 'RDWTB'. The first inverter IV1 inverts an output signal of the first NAND gate ND1.

The second NAND gate ND2 performs a NAND operation of the column pulse enable signal 'pre_yi_pulse_en' and an output signal of the first inverter IV1. The delay unit 111 delays an output signal of the second NAND gate ND2. The delay unit 111 can be implemented by a plurality of inverters. The third NAND gate ND3 performs a NAND operation of the output signal of the second NAND gate ND2 and an output signal of the delay unit 111.

When the multi-test mode signal 'tm_multi' and the read/write discriminating signal 'RDWTB' are at a high level, the multi-read signal 'multi_rd_en' is output at a high level if the column pulse enable signal 'pre_yi_pulse_en' is at a high level.

When the multi-test mode signal 'tm_multi' or the read/write discriminating signal 'RDWTB' is at a low level, the multi-read signal 'multi_rd_en' is output at a low level regardless of the column pulse enable signal 'pre_yi_pulse_en'.

Figure 8:
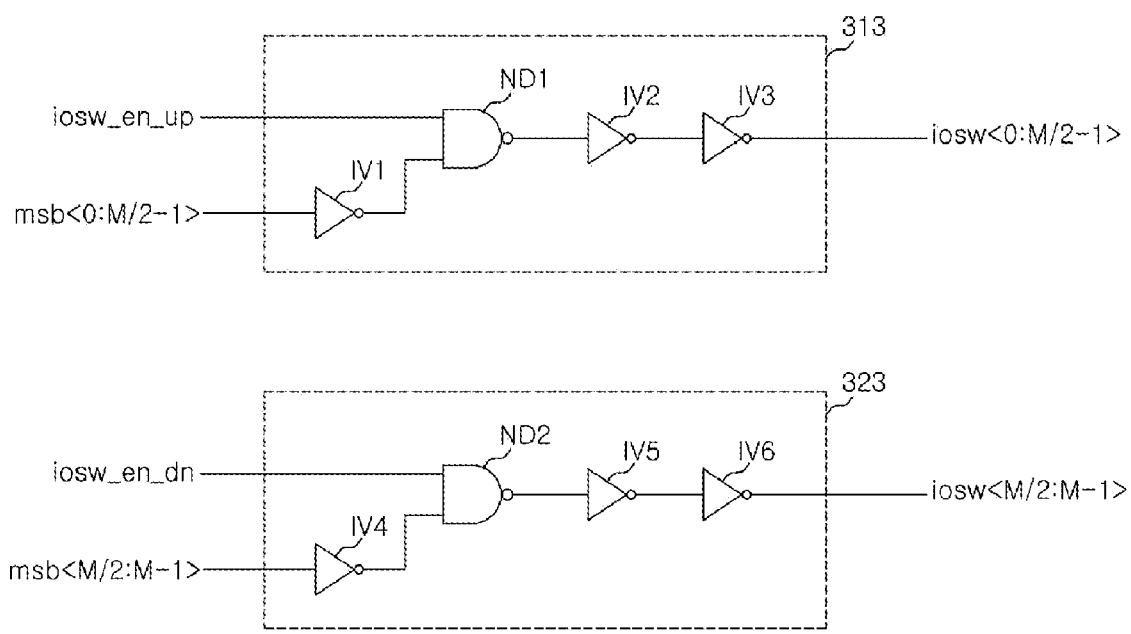
FIG. 8 is a detailed circuit diagram illustrating an example of a structure of a third up mat control unit and a third down mat control unit in FIG. 7.

The delay unit 111 increases a pulse width of the multi-read signal 'multi_rd_en' in order that the multi-read signal 'multi_rd_en' has a wider pulse width than the column pulse enable signal 'pre_yi_pulse_en' as shown in FIG. 8.

Figure 3:
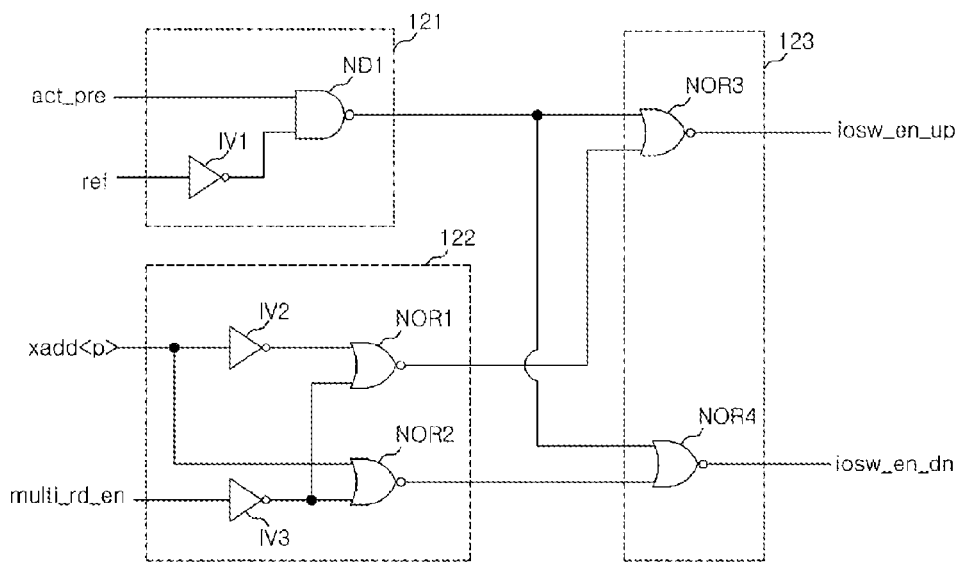
FIG. 3 is a detailed circuit diagram illustrating an example of a structure of an I/O switch control signal generating unit that can be included in the circuit shown in FIG. 1.

FIG. 3 is a detailed circuit diagram illustrating an example of a structure of the I/O switch control signal generating unit 120 in FIG. 1.

Referring to FIG. 3, the I/O switch control signal generating unit 120 can include an active driving unit 121, a multi-test control unit 122, and an output unit 123.

The active driving unit 121 is enabled according to the active signal 'act_pre' and a refresh signal 'ref'. The active driving unit 121 can include a first inverter IV1 and a first NAND gate ND1. The first inverter IV1 inverts the refresh signal 'ref'. The first NAND gate ND1 performs a NAND operation of an output signal of the first inverter IV1 and the active signal 'act_pre'.

The multi-test control unit 122 is enabled according to the up and down mat information address signal 'Xadd<p>' and the multi-read signal 'multi_rd_en'.

The multi-test control unit 122 can include a second inverter IV2, a third inverter IV3, a first NOR gate NOR1, and a second NOR gate NOR2. The second inverter IV2 inverts the up and down mat information address signal 'Xadd<p>'. The third inverter IV3 inverts the multi-read signal 'multi_rd_en'. The first NOR gate NOR1 performs a NOR operation of output signals of the second inverter IV2 and the third inverter IV3. The second NOR gate NOR2 performs a NOR operation of the up and down mat information address signal 'Xadd<p>' and an output signal of the third inverter IV3.

The output unit 123, which receives output signals of the active driving unit 121 and the multi-test control unit 122, can output the up mat I/O switch control signal 'iosw_en_up' and the down mat I/O switch control signal 'iosw_en_dn'.

The output unit 123 can include a third NOR gate NOR3 and a fourth NOR gate NOR4.

The third NOR gate NOR3 performs a NOR operation of output signals of the first NAND gate ND1 and the first NOR gate NOR1. The fourth NOR gate NOR4 performs a NOR operation of the output signal of the first NAND gate ND1 and an output signal of the second NOR gate NOR2.

The operation of the I/O switch control signal generating unit 120 in FIG. 3 will be described in detail below.

If the multi-read signal 'multi_rd_en' is at a low level, the output signals of the first NOR gate NOR1 and the second NOR gate NOR2 are at a low level regardless of the up and down mat information address signal 'Xadd<p>'. Meanwhile, when the active signal 'act_pre' is at a high level and the refresh signal 'ref' is at a low level, the first NAND gate ND1 outputs a low-level signal. Accordingly, both the third NOR gate NOR3 and the fourth NOR gate NOR4 output high-level signals. That is, the up mat I/O switch control signal 'iosw_en_up' and the down mat I/O switch control signal 'iosw_en_dn' are at a high level.

On the other hand, when the refresh signal 'ref' is enabled at a high level in a refresh mode, the first NAND gate ND1 outputs a high-level signal and then the third NOR gate NOR3 and the fourth NOR gate NOR4 output low-level signals as output signals.

Therefore, in the case where the multi-read signal 'multi_rd_en' is at a low level, the up mat I/O switch control signal 'iosw_en_up' and the down mat I/O switch control signal 'iosw_en_dn' are at a high level in the active operation mode and the up mat I/O switch control signal 'iosw_en_up' and the down mat I/O switch control signal 'iosw_en_dn' are at a low level in the refresh mode.

Meanwhile, when the multi-read signal 'multi_rd_en' is at a high level, the output signals of the first NOR gate NOR1 and the second NOR gate NOR2 are changed according to the up and down mat information address signal 'Xadd<p>' because the output signal of the third inverter IV3 is at a low level.

At this time, when the up and down mat information address signal 'Xadd<p>' is at a high level, an output signal of the first NOR gate NOR1 is at a high level and the output signal of the second NOR gate NOR2 is at a low level.

Accordingly, the third NOR gate NOR3, which receives the output signal of the first NOR gate NOR1, outputs the up mat I/O switch control signal 'iosw_en_up' at a low level regardless of the active signal 'act_pre'.

The fourth NOR gate NOR4, which receives the output signal of the second NOR gate NOR2, outputs a high-level signal when the active signal 'act_pre' is enabled, and outputs the down mat I/O switch control signal 'iosw_en_dn' of a low level when the active signal 'act_pre' is disabled.

Furthermore, when the up and down mat information address signal 'Xadd<p>' is at a low level in the case where multi-read signal 'multi_rd_en' is at a high level, the first NOR gate NOR1 outputs a low-level signal and the second NOR gate NOR2 outputs a high-level signal. Accordingly, the output signal of the fourth NOR gate NOR4 is at a low level regardless of the active signal 'act_pre' and the output signal of the third NOR gate NOR3 is dependent upon the signal level of the active signal 'act_pre'.

Therefore, when the multi-read signal 'multi_rd_en' is enabled, one of the output signals of the third NOR gate NOR3 and the fourth NOR gate NOR4 is enabled according to the up and down mat information address signal 'Xadd<p>'.

Figure 4:
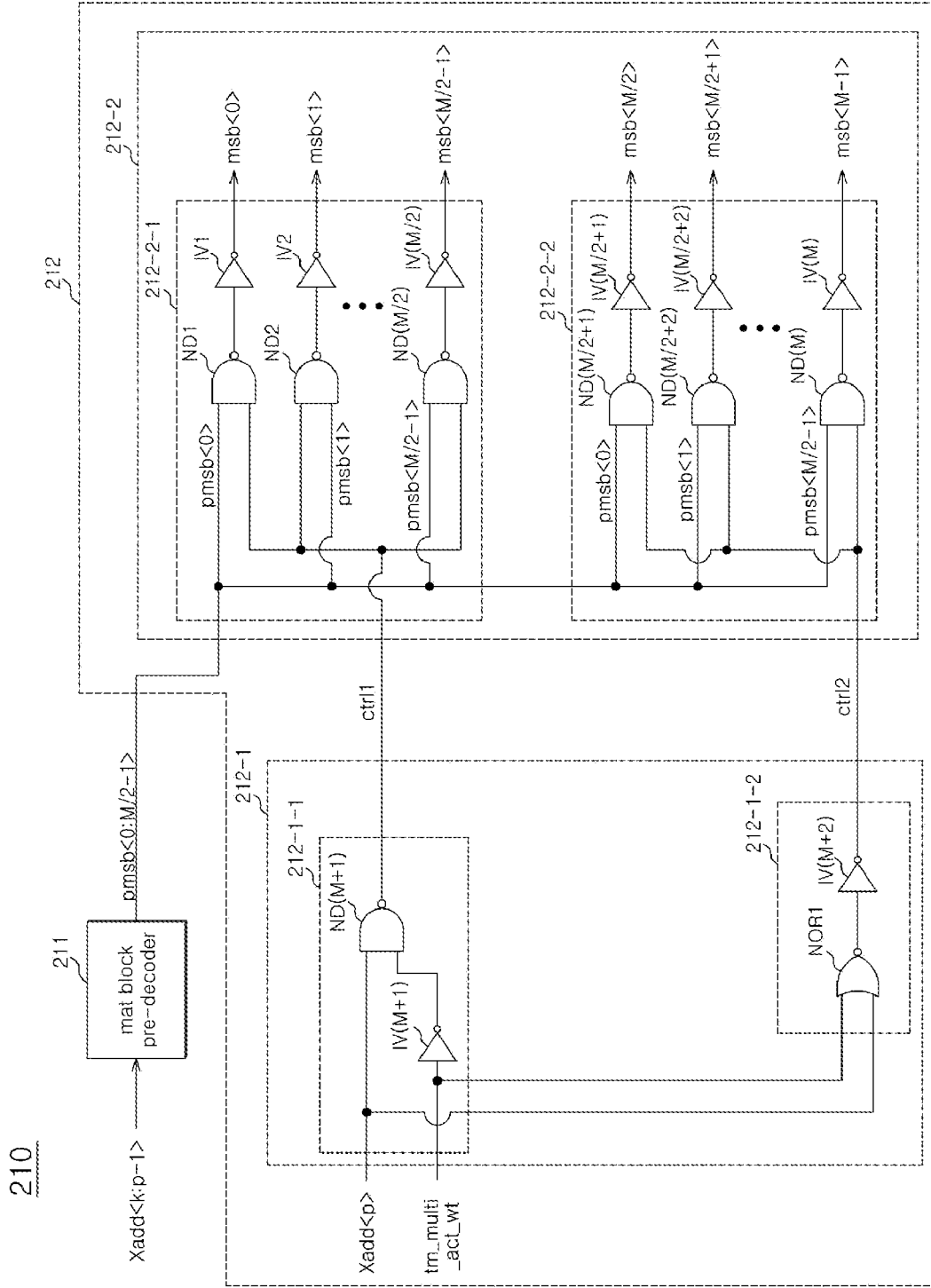
FIG. 4 is a detailed circuit diagram illustrating an example of a structure of a mat select decoder that can be included in the circuit shown in FIG. 1.

FIG. 4 is a detailed circuit diagram illustrating an example of the structure of the mat select decoder 210 in FIG. 1.

Referring to FIG. 4, the mat select decoder 210 can include a mat block pre-decoder 211 and a main decoder 212.

The mat block pre-decoder 211 outputs pre-decoding signals 'pmsb<0:M/2–1>' by predecoding the row address signals 'Xadd<k:p–1>'.

The main decoder 212 receives and decodes the pre-decoding signals 'pmsb<0:M/2–1>' according to the multi-test mode active write signal 'tm_multi_act_wt' and the up and down mat information address signal 'Xadd<p>'.

The main decoder 212 can include a mat control unit 212-1 and a decoding unit 212-2.

The mat control unit 212-1 receives the multi-test mode active write signal 'tm_multi_act_wt' and the up and down mat information address signal 'Xadd<p>', and then outputs an up mat control signal 'ctrl1' and a down mat control signal 'ctrl2'.

The decoding unit 212-2 receives the pre-decoding signals 'pmsb<0:M/2–1>', the up mat control signal 'ctrl1' and the down mat control signal 'ctrl2', and then outputs decoding signals 'msb<0:M–1>'.

The mat control unit 212-1 can include an up mat control unit 212-1-1 and a down mat control unit 212-1-2.

In the multi-test mode, the up mat control unit 212-1-1 outputs the up mat control signal 'ctrl1', which is enabled, based on the selection of the up mat. In the multi-test mode, the down mat control unit 212-1-2 outputs the down mat control signal 'ctrl2', which is enabled, based on the selection of the down mat.

The up mat control unit 212-1-1 can include an (M+1)th inverter IV(M+1) and an (M+1)th NAND gate ND(M+1).

The (M+1)th inverter IV(M+1) inverts the multi-test mode active write signal 'tm_multi_act_wt'. The (M+1)th NAND gate ND(M+1) performs a NAND operation of an output signal of the (M+1)th inverter IV(M+1) and the up and down mat information address signal 'Xadd<p>' and then outputs the up mat control signal 'ctrl1'.

The down mat control unit 212-1-2 can include a NOR gate NOR1 and an inverter IV(M+2).

The NOR gate NOR1 performs a NOR operation of the multi-test mode active write signal 'tm_multi_act_wt' and the up and down mat information address signal 'Xadd<p>' and then outputs the down mat control signal 'ctrl2'.

The decoding unit 212-2 can include an up mat decoding unit 212-2-1 and a down mat decoding unit 212-2-2.

The up mat decoding unit 212-2-1 receives the up mat control signal 'ctrl1' and the pre-decoding signals 'pmsb<0:M/2–1>' and then outputs the decoding signals 'msb<0:M/2–1>'.

The down mat decoding unit 212-2-2 receives the down mat control signal 'ctrl2' and the pre-decoding signals 'pmsb<0:M/2–1>' and then outputs the decoding signals 'msb<M/2:M–1>'.

When the up mat control signal 'ctrl1' is enabled, the up mat decoding unit 212-2-1 outputs the pre-decoding signals 'pmsb<0:M/2–1>' as the decoding signals 'msb<0:M/2–1>'.

When the down mat control signal 'ctrl2' is enabled, the down mat decoding unit 212-2-2 outputs the pre-decoding signals 'pmsb<0:M/2–1>' as the decoding signals 'msb<M/2:M–1>'.

The up mat decoding unit 212-2-1 can include a plurality of NAND gates ND1 to ND(M/2) and a plurality of inverters IV1 to IV(M/2).

The plurality of the NAND gates ND1 to ND(M/2) receive the up mat control signal 'ctrl1' and a part of the pre-decoding signals 'pmsb<0:M/2–1>', which are involved in the up mat, and then performs the NAND operation of the received signals.

The plurality of the inverters IV1 to IV(M/2) invert output signals of the plurality of the NAND gates ND1 to ND(M/2), respectively, and then outputs the decoding signals 'msb<0:M/2–1>'.

The down mat decoding unit 212-2-2 can include a plurality of NAND gates ND(M/2+1) to ND(M) and a plurality of inverters IV(M/2+1) to IV(M).

The plurality of the NAND gates ND(M/2+1) to ND(M) receive the down mat control signal 'ctrl2' and a part of the pre-decoding signals 'pmsb<0:M/2–1>', which are involved in the down mat, and then performs the NAND operation of the received signals.

The plurality of the inverters IV(M/2+1) to IV(M) output the decoding signals 'msb<M/2:M–1>' by inverting output signals of the plurality of the NAND gates ND(M/2+1) to ND(M), respectively.

The operation of the mat select decoder 210 in FIG. 4 will be described in detail below.

At the time of the multitest, the multi-test mode active write signal 'tm_multi_act_wt' is at a high level. Accordingly, the output signal of the (M+1)th inverter IV(M+1) is at a low level and an output signal of the (M+1)th NAND gate ND(M+1) is at a high level. Therefore, the up mat decoding unit 212-2-1 outputs the pre-decoding signals 'pmsb<0:M/2–1>' as the decoding signals 'msb<0:M/2–1>'. Furthermore, the output signal of the first NOR gate NOR1 is at a low level and an output signal of the second inverter IV2 is at a high level. The down mat decoding unit 212-2-2 outputs the pre-decoding signals 'pmsb<0:M/2–1>' as the decoding signals 'msb<M/2:M–1>'. Accordingly, when the multi-test mode active write signal 'tm_multi_act_wt' is at a high level, both the down mat decoding unit 212-2-2 and the up mat decoding unit 212-2-1 output the pre-decoding signals 'pmsb<0:M/2–1>' as the decoding signals 'msb<0:M–1>'.

When the output signal of the (M+1)th inverter IV(M+1) is at a high level and the up and down mat information address signal 'Xadd<p>' is at a high level, the output signal of the (M+1)th NAND gate ND(M+1) is at a low level and, when the up and down mat information address signal 'Xadd<p>' is at a low level, the output signal of the (M+1)th NAND gate ND(M+1) is at a high level. Since the output signal of the (M+1)th NAND gate ND(M+1) is at a low level when the up and down mat information address signal 'Xadd<p> is at a high level, the up mat decoding unit 212-2-1 outputs the decoding signals 'msb<0:M/2–1>' of which all the bits are at a low level regardless of the pre-decoding signals 'pmsb<0:M/2–1>'. Since the output signal of the (M+1)th NAND gate ND(M+1) is a t a high level when the up and down mat information address signal 'Xadd<p>' is at a low level, the up mat decoding unit 212-2-1 outputs the pre-decoding signals 'pmsb<0:M/2−1>' as the decoding signals 'msb<0:M/2−1>'.

Furthermore, in a normal node, when the multi-test mode active write signal 'tm_multi_act_wt' is at a low level and the up and down mat information address signal 'Xadd<p>' is at a low level, the output signal of the first NOR gate NOR1 is at a high level and an output signal of the (M+2)th inverter IV(M+2) is at a low level. Accordingly, the down mat decoding unit 212-2-2 outputs the decoding signals 'msb<M/2:M−1>' of which all the bits are at a low level regardless of the pre-decoding signals 'pmsb<0:M/2−1>'. When the multi-test mode active write signal 'tm_multi_act_wt' is at a low level and the up and down mat information address signal 'Xadd<p>' is at a high level, the output signal of the first NOR gate NOR1 is at a low level and an output signal of the (M+2)th inverter IV(M+2) is at a high level. Accordingly, the down mat decoding unit 212-2-2 outputs the pre-decoding signals 'pmsb<0:M/2−1>' as the decoding signals 'msb<M/2:M−1>'.

That is, when the up and down mat information address signal 'Xadd<p>' is at a low level, the up mat decoding unit 212-2-1 outputs the pre-decoding signals 'pmsb<0:M/2−1>' as the decoding signals 'msb<0:M/2−1>' and the down mat decoding unit 212-2-2 outputs the decoding signals 'msb<M/2:M−1>' of which all the bits are at a low level. Furthermore, when the up and down mat information address signal 'Xadd<p>' is at a high level, the up mat decoding unit 212-2-2 outputs the decoding signals 'msb<0:M/2−1>' of which all the bits are at a low level and the down mat decoding unit 212-2-2 outputs the pre-decoding signals 'pmsb<0:M/2−1>' as the decoding signals 'msb<M/2:M−1>'.

Accordingly, since the multi-test operation is carried out when the multi-test mode active write signal 'tm_multi_act_wt' is at a high level, both the up mat decoding unit 212-2 and the down mat decoding unit 212-2 output the pre-decoding signals 'pmsb<0:M/2−1>' as the decoding signals 'msb<0:M−1>. In addition, when the multi-test mode active write signal 'tm_multi_act_wt' is at a low level, the normal operation is carried out so that signals to enable the mat, which is correspondent to the mat information address signals 'Xadd<k:p>' and the up and down mat information address signal 'Xadd<p>', are output as the decoding signals 'msb<0:M−1>'.

Figure 5:
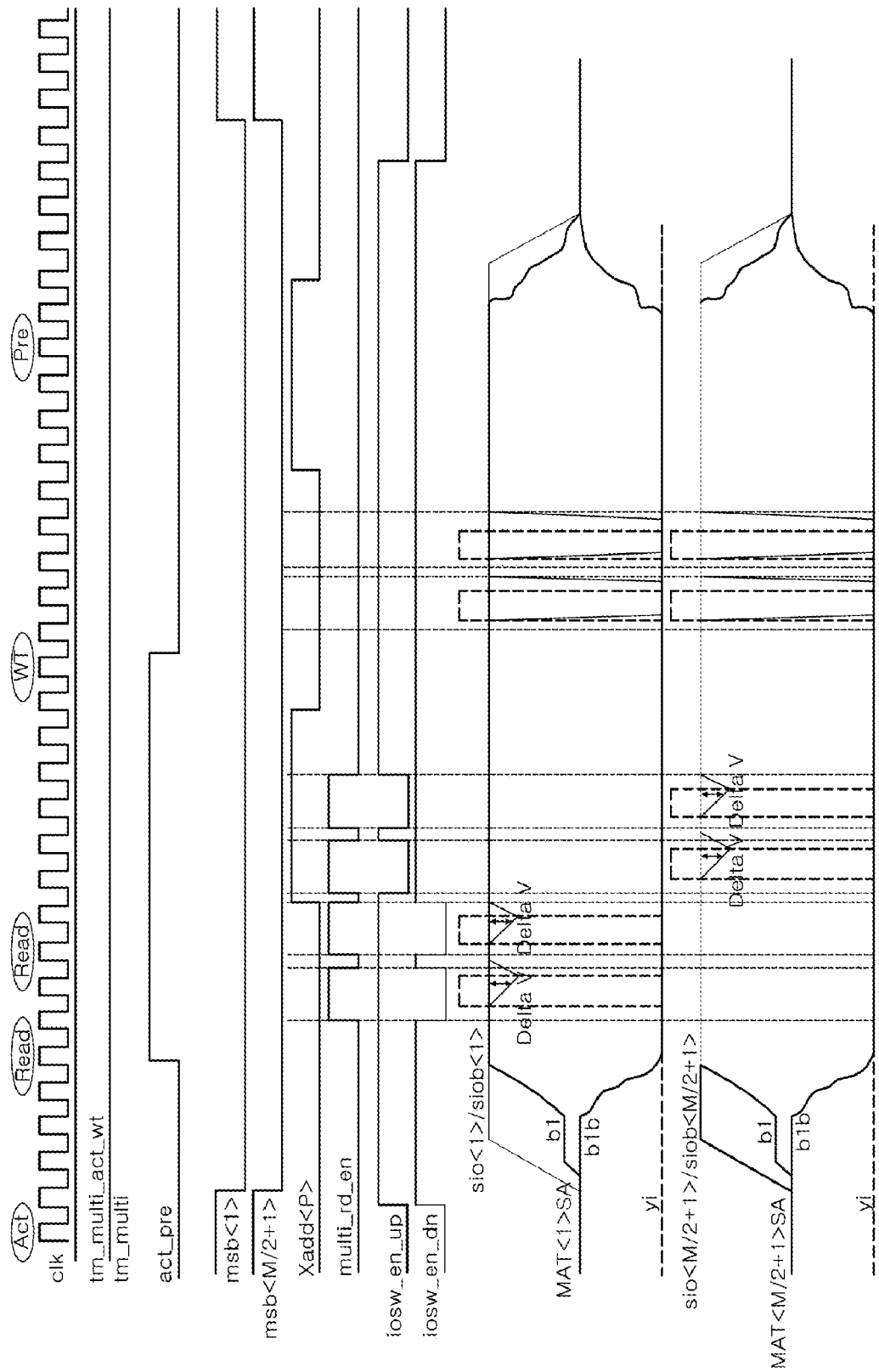
FIG. 5 is a timing diagram illustrating an operation of the semiconductor integrated circuit in FIG. 1.

The operation of the semiconductor integrated circuit in FIGS. 1 to 4 will be described in detail below referring to FIG. 5.

In the multi-test mode, the active signal 'act_pre' is enabled so that the semiconductor integrated circuit enters the active operation mode. At the active operation, the word lines are enabled and the sense amplifiers are enabled. The multi-test mode active write signal 'tm_multi_act_wt' is enabled. Accordingly, the mat select decoder 210 outputs the pre-decoding signals 'pmsb<0:M/2−1>' as the decoding signals 'msb<0:M−1>' regardless of the up and down mat information address signal 'Xadd<p>'. For example, assuming that the address signals to enable the first and (M/2+1)th mats are input, the mat select signal 'msb<1>' to enable one of the plurality of the up mats, i.e., the first mat which is correspondent to the pre-decoding signals 'pmsb<0:M/2−1>', is enabled and the mat select signal 'msb<M/2+1>' to enable one of the plurality of the down mats, i.e., the (M/2+1)th mat which is correspondent to the pre-decoding signals 'pmsb<0:M/2−1>', is enabled. In this case, since the two mat select signals 'msb<1>' and 'msb<M/2+1>' are enabled, the word lines are enabled to execute the active operation within the two mats. As a result, the test time can be reduced.

Thereafter, in the read operation mode, the read operation is first carried out so that the cell data which are correspondent to the word lines are read out. If the column pulse enable signal 'pre_yi_pulse_en' is enabled, the multi-read signal 'multi_rd_en' is enabled according to the column pulse enable signal 'pre_yi_pulse_en'. The multi-read signal generating unit 110 in FIG. 5 outputs the multi-read signal 'multi_rd_en' of which the enable section is a wider pulse width than that of the column pulse enable signal 'pre_yi_pulse_en'. Accordingly, the I/O switch control signal generating unit 120 that receives the enabled multi-read signal 'multi_rd_en' enables the up mat I/O switch control signal 'iosw_en_up', which is correspondent to the first mat, according to the up and down mat information address signal 'Xadd<p>'. Furthermore, in the I/O switch control signal generating unit 120, the down mat I/O switch control signal 'iosw_en_dn' which is correspondent to the (M/2+1)th mat is output at a low level according to the multi-read signal 'multi_rd_en'. The up mat control unit 310 that receives the enabled up mat I/O switch control signal 'iosw_en_up' outputs an enabled I/O switch signal and the down mat control unit 320 that receives the down mat I/O switch control signal 'iosw_en_dn' outputs a disabled I/O switch signal. Accordingly, since the cell data which are correspondent to the word lines within the first mat are read out and the I/O switch is open, the data are transmitted to the local I/O line and thereafter the data are sequentially transmitted to the sense amplifier and data pads. The cell data which are correspondent to the word lines within the (M/2+1)th mat are not transmitted by the I/O switch signal so that the data are not loaded on the local I/O line.

After the cell data which are correspondent to the word lines within the first mat are read out, the read operation to read the cell data, which are correspondent to the word lines within the (M/2+1)th mat, is carried out and this read operation within the (M/2+1)th mat is the same as that within the first mat.

Therefore, in the active mode, the first mat and the (M/2+1)th mat are simultaneously activated so that the corresponding word lines are simultaneously activated and the data are amplified by the sense amplifier. Thereafter, in the read operation mode, the data within the first mat are first read out and the data within the (M/2+1)th mat are read out later. Accordingly, the active time is reduced and the read time is needed in each of the first mat and the (M/2+1)th mat. In the test mode having a long active time, the test time can be reduced in the semiconductor integrated circuit according to the present disclosure.

Furthermore, in the case where the write operation is carried out after the read operation, the multi-read signal generating unit 110 outputs the multi-read signal 'multi_rd_en' at a low level because the read/write discriminating signal 'RDWTB' is at a low level. Accordingly, the I/O switch control signal generating unit 120 outputs both the up mat I/O switch control signal 'iosw_en_up' and the down mat I/O switch control signal 'iosw_en_dn' at a high level. Even if the plurality of the data are simultaneously written in the calls, it is possible to transmit the data because the I/O switches are open in the up and the down mats. Referring to the timing chart of the semiconductor integrated circuit according to the present disclosure, after the read operation, the test time is further reduced with the time deduction in the multitest by rightly performing the write operation without an additional operation such as the precharging operation.

That is, at the time of the read test, since the read/write discriminating signal 'RDWTB' is at a high level, the semiconductor integrated circuit enters the multi-test mode and then the data are sequentially read out from the up mat and the down mat through the word lines which are simultaneously activated at the active operation of the read operation. At the time of the write test, since the read/write discriminating signal 'RDWTB' is at a low level, the semiconductor integrated circuit does not enter the multi-test mode and then the plurality of the data are simultaneously written at the write operation. Since the write operation according to the present disclosure can be carried out based on that of the conventional semiconductor integrated circuit and the cell data are simultaneously written in the two mats without a data collision, this test time can be more reduced than that of the write operation in the multi-test mode.

Figure 6:
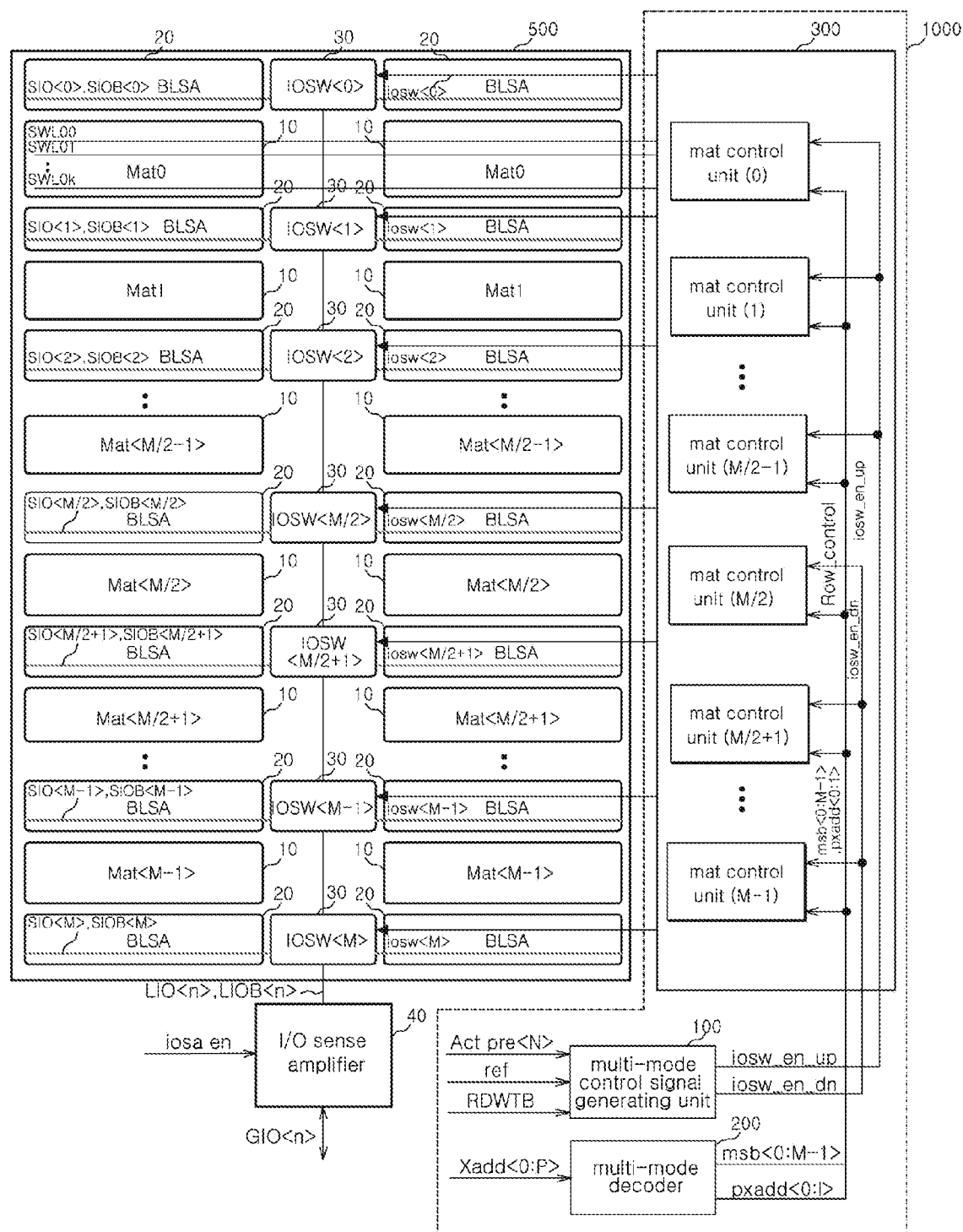
FIG. 6 is a block diagram illustrating an example of a structure of a semiconductor integrated circuit to which the test circuit of FIG. 1 is adopted.

FIG. 6 is a block diagram illustrating an example of a structure of a semiconductor integrated circuit to which the test circuit of FIG. 1 is adopted.

Referring to FIG. 6, the semiconductor integrated circuit can include a memory cell array area 500 having a plurality of mats 10, and a plurality of bit line sense amplifier array blocks 20, a plurality of I/O switching units 30, and an I/O sense amplifier 40.

The multi-mode control signal generating unit 100, the multi-mode decoder 200 and the mat control unit 300 in FIG. 6 have the same configuration as those shown in FIG. 1. Accordingly, the switching units 30, which receives the sense amplifier enable signals 'SA_en<0:M−1>' and the word line enable signals 'WL_en<0:M−1>', are turned on in response to the I/O switch signals 'iosw<0:M−1>'. The word lines in the mat are activated according to the word line enable signals 'WL_en<0:M−1>'. The bit line sense amplifier 20 is activated according to the sense amplifier enable signals 'SA_en<0:M−1>'.

Figure 7:
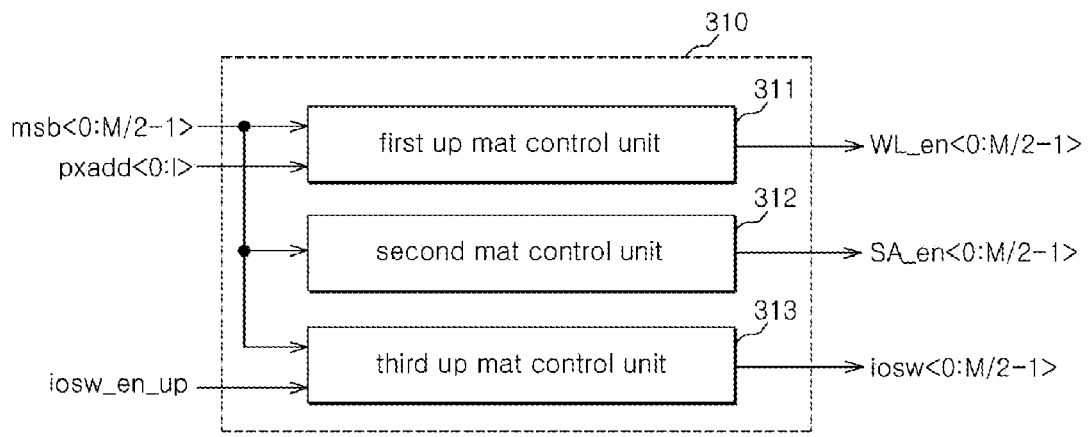
FIG. 7 is a block diagram illustrating an example of a structure of an up mat control unit and a down mat control unit that can be included in the circuit shown in FIG. 1.
Figure 7:
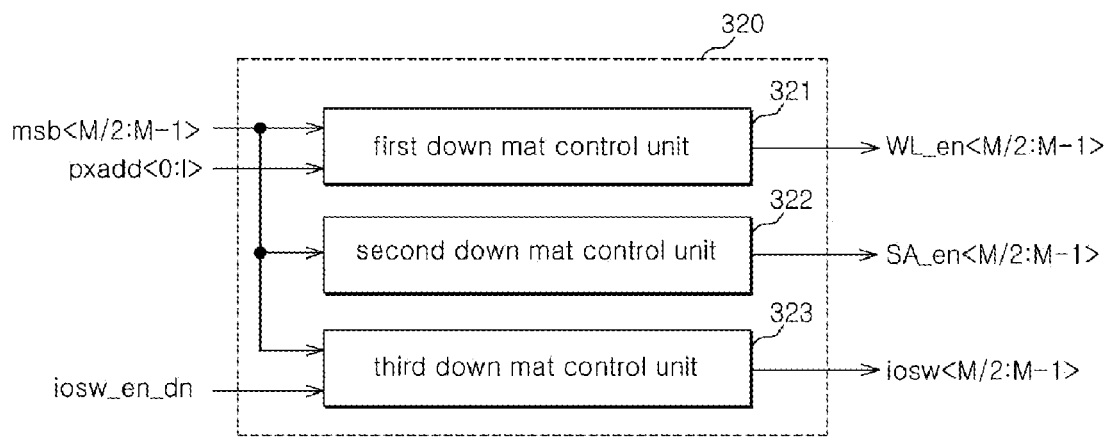

FIG. 7 is a block diagram illustrating an example of a structure of the up mat control unit 310 and the down mat control unit 320 in FIG. 1.

The up mat control unit 310 can include a first up mat control unit 311 to a third up mat control unit 313. The first up mat control unit 311 receives the multi-mat select signals 'msb<0:M/2−1>' and the predetermined address signals 'pxadd<0:l>' and then outputs the word line enable signals 'WL_en<0:M/2−1>'. The second up mat control unit 312 receives the multi-mat select signals 'msb<0:M/2−1>' and then outputs the sense amplifier enable signals 'SA_en<0:M/2−1>'. The third up mat control unit 313 receives the multi-mat select signals 'msb<0:M/2−1>' and the up mat I/O switch control signal 'iosw_en_up' and then outputs the I/O switch signals 'iosw<0:M/2−1>'.

The down mat control unit 320 can include a first down mat control unit 321 to a third down mat control unit 323. The first down mat control unit 321 receives the multi-mat select signals 'msb<M/2:M−1>' and the predetermined address signals 'pxadd<0:l>' and then outputs the word line enable signals 'WL_en<M/2:M−1>'. The second down mat control unit 322 receives the multi-mat select signals 'msb<M/2:M−1>' and then outputs the sense amplifier enable signals 'SA_en<M/2:M−1>'. The third down mat control unit 323 receives the multi-mat select signals 'msb<M/2:M−1>' and the down mat I/O switch control signal 'iosw_en_dn' and then outputs the I/O switch signals 'iosw<M/2:M−1>'.

FIG. 8 is a detailed circuit diagram illustrating an example of a structure of the third up mat control unit 313 and the third down mat control unit 323 in FIG. 7.

The third up mat control unit 313 can include a first NAND gate ND1 and a first inverter IV1 to a third inverter IV3 to output the I/O switch signals 'iosw<0:M/2−1>'. The first inverter IV1 inverts the multi-mat select signals 'msb<0:M/2−1>'. The first NAND gate ND1 performs a NAND operation of the up mat I/O switch control signal 'iosw_en_up' and an output signal of the first inverter IV1. The second inverter IV2 inverts an output signal of the first NAND gate ND1. The third inverter IV3 outputs the I/O switch signals 'iosw<0:M/2−1>', which are correspondent to the up mats, by inverting an output signal of the second inverter IV2. When the up mat I/O switch control signal 'iosw_en_up' is at a low level, the I/O switch signals 'iosw<0:M/2−1>', which are correspondent to the up mats, are fixed to a high level regardless of the multi-mat select signals 'msb<0:M/2−1>'. When the up mat I/O switch control signal 'iosw_en_up' is at a high level and the multi-mat select signals 'msb<0:M/2−1>' are at a high level, the I/O switch signals 'iosw<0:M/2−1>', which are correspondent to the up mats, are at a high level. When the multi-mat select signals 'msb<0:M/2−1>' are at a low level, the I/O switch signals 'iosw<0:M/2−1>', which are correspondent to the up mats, are at a low level.

Furthermore, the third down mat control unit 323 can include a second NAND gate ND2 and a fourth inverter IV4 to a sixth inverter IV6 to output the I/O switch signals 'iosw<M/2:M−1>'. The fourth inverter IV4 inverts the multi-mat select signals 'msb<M/2:M−1>'. The second NAND gate ND2 performs a NAND operation of the down mat I/O switch control signal 'iosw_en_dn' and an output signal of the fourth inverter IV4. The fifth inverter IV5 inverts an output signal of the second NAND gate ND2. The sixth inverter IV6 outputs the I/O switch signals 'iosw<M/2: M−1>', which are correspondent to the down mats, by inverting an output signal of the fifth inverter IV5. In similar to the third up mat control unit 313, the third down mat control unit 323 is configured to active or inactive the I/O switch signals 'iosw<M/2: M−1>', which are correspondent to the down mats, according to the down mat I/O switch control signal 'iosw_en_dn' and the multi-mat select signals 'msb<M/2:M−1>'.

Even though the case that the two mats are simultaneously activated is illustrated in the present disclosure, more than two mats can be simultaneously activated for the test.

That is, when the two mats are simultaneously activated in the semiconductor integrated circuit according to the present disclosure, the test time can be reduced to a half and, when four mats are simultaneously activated, the test time can be reduced to a quarter.

As apparent from the above, the semiconductor integrated circuit and the multi-test method thereof according to the present disclosure reduce the test time remarkably with cost effectiveness by simultaneously activating a plurality of mats without a data collision.

While certain embodiments have been described above, it will be understood that the embodiments described are by way of example only. Accordingly, the systems and methods described herein should not be limited based on the described embodiments. Rather, the systems and methods described herein should only be limited in light of the claims that follow when taken in conjunction with the above description and accompanying drawings.

What is claimed is:

1. A semiconductor integrated circuit comprising:
   a memory cell array area having a plurality of mats, wherein the plurality of mats are divided into up mats and down mats positioned below the up mats;
   a multi-mode control signal generating unit configured to control an activation of up and down mat I/O switch control signals, which control I/O switches in the up and down mats, according to a multi-test mode signal and a read/write discriminating signal;
   a multi-mode decoder configured to output multi-mat select signals to simultaneously activate a plurality of mats according to a multi-test mode active write signal; and
   a mat controller configured to enable word lines and the I/O switches according to the up and down mat I/O switch control signals and the multi-mat select signals,
   wherein the multi-mode control signal generating unit enables one of the up mat I/O switch control signal and the down mat I/O switch control signal in response to an up and down mat information address signal, when the multi-test mode signal is enabled and the read/write discriminating signal is at a first voltage level, and enables both the up mat I/O switch control signal and the down mat I/O switch control signal regardless of the up and down mat information address signal, when the read/write discriminating signal is at a second voltage level.

2. The semiconductor integrated circuit of claim 1, wherein the multi-mode control signal generating unit is configured to receive the up and down mat information address signal and an active signal and then outputs the up and down mat I/O switch control signals in response to the read/write discriminating signal, the multi-test mode signal and a column pulse enable signal.

3. The semiconductor integrated circuit of claim 2, wherein the multi-mode control signal generating unit includes:
   a multi-read signal generating unit configured to receive the read/write discriminating signal, the multi-test mode signal and a column pulse enable signal and then generate a multi-read signal; and
   an I/O switch control signal generating unit configured to receive the multi-read signal and output the up/down mat I/O switch control signal according to the up and down mat information address signal and the active signal.

4. The semiconductor integrated circuit of claim 3, wherein the multi-read signal generating unit outputs the multi-read signal, which is enabled, when the column pulse enable signal is enabled.

5. The semiconductor integrated circuit of claim 4, wherein the multi-read signal generating unit outputs the multi-read signal which is enabled when the column pulse enable signal is enabled if the multi-test mode signal and the read/write discriminating signal are enabled, and outputs the multi-read signal which is disabled when the read/write discriminating signal is disabled.

6. The semiconductor integrated circuit of claim 5, wherein the multi-read signal generating unit includes:
   a first NAND gate configured to perform a NAND operation of the multi-test mode signal and the read/write discriminating signal;
   an inverting element configured to invert an output signal of the first NAND gate;
   a second NAND gate configured to perform a NAND operation of an output signal of the inverting element and the column pulse enable signal;
   a delay unit configured to delay an output signal of the second NAND gate; and
   a third NAND gate configured to perform a NAND operation of the output signal of the second NAND gate and an output signal of the delay unit.

7. The semiconductor integrated circuit of claim 3, wherein the I/O switch control signal generating unit includes:
   an active driving unit configured to receive the active signal and a refresh signal;
   a multi-test control unit configured to receive the up and down mat information address signal and the multi-read signal; and
   an output unit configured to receive an output signal of the active driving unit and an output signal of the multi-test control unit and then output the up mat I/O switch control signal and the down mat I/O switch control signal.

8. The semiconductor integrated circuit of claim 1, wherein the multi-mode decoder simultaneously activates the multi-mat select signal, which control one of the up mats that are correspondent to row address signals, and the multi-mat select signal, which control one of the down mats that are correspondent to the row address signal, when the multi-test mode active write signal is activated.

9. The semiconductor integrated circuit of claim 8, wherein the multi-mode decoder is configured to receive and decode the row address signals according to the multi-test mode active write signal and to output the multi-mat select signals and predetermined address signals.

10. The semiconductor integrated circuit of claim 9, wherein the multi-mode decoder includes:
    a mat select decoder configured to output the multi-mat select signal by decoding mat information address signals of the row address signals according to the multi-test mode active write signal; and
    an address decoder configured to output address signals by decoding address signals, except for the mat information address signals, of the row address signals according to the active signal.

11. The semiconductor integrated circuit of claim 10, wherein the mat select decoder includes:
    a mat block pre-decoder configured to output per-decoding signals by decoding the address signals, except for the up and down mat information address signal, of the row address signals; and
    a main decoder configured to decode the per-decoding signals according to the multi-test mode active write signal and the up and down mat information address signal.

12. The semiconductor integrated circuit of claim 11, wherein the main decoder includes:
    a mat control unit configured to receive the multi-test mode active write signal and the up and down mat information address signal and then output an up mat control signal and a down mat control signal; and
    a decoding unit configured to receive the pre-decoding signals, the up mat control signal and the down mat control signal and then output decoding signals.

13. The semiconductor integrated circuit of claim 12, wherein the mat control unit includes:
    an up mat control unit configured to output an up mat control signal, which is enabled when the up mat is enabled, at a multi-test mode; and
    a down mat control unit configured to output a down mat control signal, which is enabled when the down mat is enabled, at the multi-test mode.

14. The semiconductor integrated circuit of claim 12, wherein the decoding unit includes:
    an up mat decoding unit configured to receive the up mat control signal and the pre-decoding signals and then output an up mat select signal; and
    a down mat decoding unit configured to receive the down mat control signal and the pre-decoding signals and then output a down mat select signal.

15. The semiconductor integrated circuit of claim 14, wherein the up mat decoding unit outputs the pre-decoding signals, which are associated with the up mat, as the decoding signals, when the up mat control signal is enabled.

16. The semiconductor integrated circuit of claim 14, wherein the down mat decoding unit outputs the pre-decoding signals, which are associated with the down mat, as the decoding signals, when the down mat control signal is enabled.

17. The semiconductor integrated circuit of claim 1, wherein the mat controller includes:
    an up mat controller configured to enable I/O switches in one of the up mats according to the up mat I/O switch control signal and the multi-mat select signal; and
    a down mat controller configured to enable I/O switches in one of the down mats according to the down mat I/O switch control signal and the multi-mat select signal.

18. The semiconductor integrated circuit of claim 17, wherein the up mat controller outputs a word line enable signal to enable word lines in one of the up mats and a sense amplifier enable signal to enable sense amplifiers in one of the up mats.

19. The semiconductor integrated circuit of claim 17, wherein the down mat controller outputs a word line enable signal to enable word lines in one of the down mats and a sense amplifier enable signal to enable sense amplifiers in one of the down mats.

* * * * *